US008796933B2

(12) United States Patent
Hermanns

(10) Patent No.: US 8,796,933 B2
(45) Date of Patent: Aug. 5, 2014

(54) GENERATING PLASMAS IN PULSED POWER SYSTEMS

(75) Inventor: Uwe Hermanns, Neuberg (DE)

(73) Assignee: Applied Materials, Inc., Santa Clara, CA (US)

( * ) Notice: Subject to any disclaimer, the term of this patent is extended or adjusted under 35 U.S.C. 154(b) by 678 days.

(21) Appl. No.: 12/965,072

(22) Filed: Dec. 10, 2010

(65) Prior Publication Data

US 2012/0146509 A1 Jun. 14, 2012

(30) Foreign Application Priority Data

Dec. 8, 2010 (EP) ..................................... 10194162

(51) Int. Cl.
*H01J 7/24* (2006.01)

(52) U.S. Cl.
USPC ..................................................... 315/111.21

(58) Field of Classification Search
USPC .............................. 315/260, 111.21, 160, 167
See application file for complete search history.

(56) References Cited

U.S. PATENT DOCUMENTS

| 5,192,894 | A | 3/1993 | Teschner |
| 5,427,669 | A | 6/1995 | Drummond |
| 5,576,939 | A | 11/1996 | Drummond |
| 5,584,974 | A | 12/1996 | Sellers |
| 6,005,218 | A | 12/1999 | Walde et al. |
| 6,282,076 | B1 | 8/2001 | Kappel et al. |
| 6,735,099 | B2 | 5/2004 | Mark |
| 7,305,311 | B2 | 12/2007 | van Zyl |
| 7,586,210 | B2 | 9/2009 | Wiedemuth et al. |
| 7,586,766 | B2 | 9/2009 | Ikeda et al. |
| 2008/0061794 | A1 | 3/2008 | Pankratz |
| 2008/0122369 | A1 | 5/2008 | Nitschke |
| 2010/0140231 | A1 | 6/2010 | Ilic |

FOREIGN PATENT DOCUMENTS

| DE | 4438463 C1 | 2/1996 |
| WO | WO2009/145093 | 12/2009 |
| WO | WO2010/031421 | 3/2010 |

OTHER PUBLICATIONS

Scholl, R.A. "Power Supplies for Pulsed Plasma Technologies: State-Of-The-Art and Outlook" Copyright 1999 Advanced Energy Industries, Inc. (8 pages).
Lutz, M. et al. "Arc Handling in RF-Superimposed DC Processes" Copyright 2006 Advanced Energy Industries, Inc. (6 pages).
Kiehne et al. "A pulser for medium-frequency modulated direct-current reactive sputter deposition of insulators" Rev. Sci. Inst. vol. 71:6, Jun. 2000 (p. 2560-2562).
PCT Search Report and Written Opinion dated Feb. 28, 2012 for Application No. PCT/EP2011/072141.
European Search Report dated Jun. 6, 2011 for Application No. EP10194162.

*Primary Examiner* — Douglas W Owens
*Assistant Examiner* — Jianzi Chen
(74) *Attorney, Agent, or Firm* — Fish & Richardson P.C.

(57) ABSTRACT

Generating plasmas in pulsed power systems. In one aspect, a system includes a plasma chamber having one or more anodes and cathodes arranged for generating a plasma in the plasma chamber, two or more plasma power supplies each having a pulsed power output suitable for generating the plasma and coupled to respective of the one or more anodes and cathodes of the plasma chamber and a signal generator supplying the input signal coupled to the inputs of the plasma power supplies. The input signal is selected to trigger the pulsing, by the arc management circuitry, of the power output from the plasma power supplies. The plasma power supplies each include arc management circuitry and an input coupled to trigger, in response to an input signal, pulsing, by the arc management circuitry, of the power output from the plasma power supply.

19 Claims, 3 Drawing Sheets

GENERATING PLASMAS IN PULSED POWER SYSTEMS

CROSS-REFERENCE TO RELATED APPLICATIONS

This application claims the priority of European Patent Application Serial No. EP 10194162.3, filed on Dec. 8, 2010.

BACKGROUND

This disclosure relates to generating plasmas in pulsed power systems.

Plasmas are collections of charged particles. The particles are separated by distances that are small enough to allow individual particles to influence multiple adjacent charged particles. Electrostatic interactions predominate over ordinary gas kinetics and bulk interactions with the collection predominate over boundary effects. Because of these properties, many consider plasmas to be fourth state of matter and distinct from solids, liquids, and gases.

Plasmas are used in a variety of commercially important processes. For example, in sputtering, the charged particles of a plasma collide with a target and cause the ejection of target material. The ejected target material can deposit on a substrate to form a film. By controlling the energy, duration, and other characteristics of the plasma, the characteristics of films deposited by sputtering can also be controlled. Other examples of commercially important plasma processes include other physical and chemical vapor deposition processes, plasma nitriding, plasma desmearing, plasma cleaning, plasma activation of substrates, and plasma etching. These processes are also impacted by the characteristics of the plasmas used in the processes.

The characteristics of a plasma, and the effectiveness of plasma processes, are impacted by the power delivery that charge particles and generates the plasma. For example, regions with enhanced electrical conductivity (e.g., arcs) may form in a plasma. In film deposition processes, arcs can lead to film inhomogeneities and lack of process control.

To control the characteristics of a plasma and the improve the effectiveness of plasma processing, power delivery to the plasma can be pulsed. In pulsed systems, the amount of power delivered to the plasma changes over time. For example, the delivered power can include a transient followed by a return to a steady state or a periodic variation between two states. For example, the polarity of the power can be inverted. Power can be pulsed independently of the characteristics of the plasma (e.g., according to a fixed schedule) or can be generated in response to the characteristics of the plasma. By pulsing the power delivered to charge particles, plasma arcing can be reduced or prevented. In film deposition processes, DC, pulsed DC, and AC power systems can be pulsed to hinder arc formation and increase the quality of deposited films.

In practice, the pulsing of the power used to generate a plasma is commonly achieved using a "pulsing unit." Pulsing units receive the output of one or more power supplies and implement the changes in power delivery that result in pulsing. Pulsing units include relatively expensive, high-power components that are used for pulsing power delivery. The input powers are switched using high power switches, generally implemented using high power transistors. Pulsing units also generally include high power reactive components (e.g., inductors, capacitors) that store input power for discharge into plasmas under the control of the high power switches.

SUMMARY

Systems and techniques for generating plasmas in pulsed power systems are described. In a first aspect, a system includes a plasma chamber having one or more anodes and cathodes arranged for generating a plasma in the plasma chamber, two or more plasma power supplies each having a pulsed power output suitable for generating the plasma and coupled to respective of the one or more anodes and cathodes of the plasma chamber and a signal generator supplying the input signal coupled to the inputs of the plasma power supplies. The input signal is selected to trigger the pulsing, by the arc management circuitry, of the power output from the plasma power supplies. The plasma power supplies each include arc management circuitry and an input coupled to trigger, in response to an input signal, pulsing, by the arc management circuitry, of the power output from the plasma power supply.

In a second aspect, a system includes a plasma chamber having one or more anodes and cathodes arranged for generating a plasma in the plasma chamber, two or more plasma power supplies each having an AC supply line input and configured to convert power received over the AC supply line input into a desired power output, wherein each of the plasma power supplies comprises arc management circuitry coupled to detect a characteristic in the power output from the plasma power supply indicative of an arc in the plasma chamber and respond to the detected characteristic by managing the power output from the plasma power supply, and a signal generator power supply coupled to the arc management circuitry of each of the two or more plasma power supplies, the arc management circuitry responding the coupling of the signal generator power supply by pulsing the power output from the plasma power supplies.

In a third aspect, a method includes generating a signal independent of conditions within a plasma chamber, coupling said signal into inputs of two or more plasma power supplies, coupling pulsed power outputs from each of the plasma power supplies to at least one anode and cathode of the plasma chamber without intervening pulsing units. The coupling of said signal triggers and synchronizes arc management circuitry of the plasma power supplies.

The first, the second, the third, and other aspects can include one or more of the following features. The plasma power supplies can each include a supply line input connectable to receive a line supply. The power output from the plasma power supplies can be received over the supply line input and pulsed in the plasma power supplies by the arc management circuitry. The input can be an arc management input for receiving signals generated by other power supplies indicating the detection of the impact of an arc by those other power supplies. The signal generator can trigger and synchronize the arc management circuitry independently of conditions within the plasma chamber. The pulsed power outputs of the plasma power supplies can be coupled to the one or more anodes and cathodes of the plasma chamber without intervening pulsing units. Each of the arc management circuitry can also include an input coupled to receive a signal indicative of the output from the plasma power supply in which it is found. Each of the arc management circuitry can also include a switch coupled to end coupling of the output of the respective plasma power supply to the respective of the anodes and cathodes, wherein the switch is responsive to the signal coupled to the input of the plasma power supply in which it is found to end the coupling of the output of the respective plasma power supply to the respective of the anodes and cathodes. Each of the arc management circuitry can be responsive to the signal coupled to the input of the plasma power supply in which it is found to invert polarity of output of the respective plasma power supply. The pulsed power output from each plasma power supply can have a frequency between 1 and 100 kHz and powers between 1 and 100 kilowatts. The input signal coupled to the inputs of the two or more plasma power supplies can have a voltage of less than 10 volts. The plasma power supplies can invert polarity of the pulsed power outputs in response to the signal on the inputs of the two or more plasma power supplies. The pulsed power outputs can be switched off in response to the signal on the inputs of the two or more plasma power supplies. Arc management can be triggered by the arc management circuitry of a first of the plasma power supplies by a second signal from another of the plasma power supplies. The second signal can be indicative of an arc in the plasma chamber. The second signal and the signal independent of conditions within a plasma chamber can be combined to generate a combined signal. The arc management of the first of the plasma power supplies can be in accordance with the combined signal. The arc management circuitry can also include an arc management output coupled to output a signal to the other of the two or more power supplies indicating detection of an impact of an arc in the plasma chamber. The system can also include circuitry for combining the signal indicating the detection of the impact of the arc with a signal output from the signal generator to generate a combined signal that is input to the arc management circuitry. The circuitry can also include comprises logic components that synthesize the signal indicating the detection of the impact of the arc with the signal output from the signal generator. The pulsed power outputs of the plasma power supplies can be coupled to the one or more anodes and cathodes of the plasma chamber without intervening pulsing units.

The details of one or more implementations are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

Figure 1:
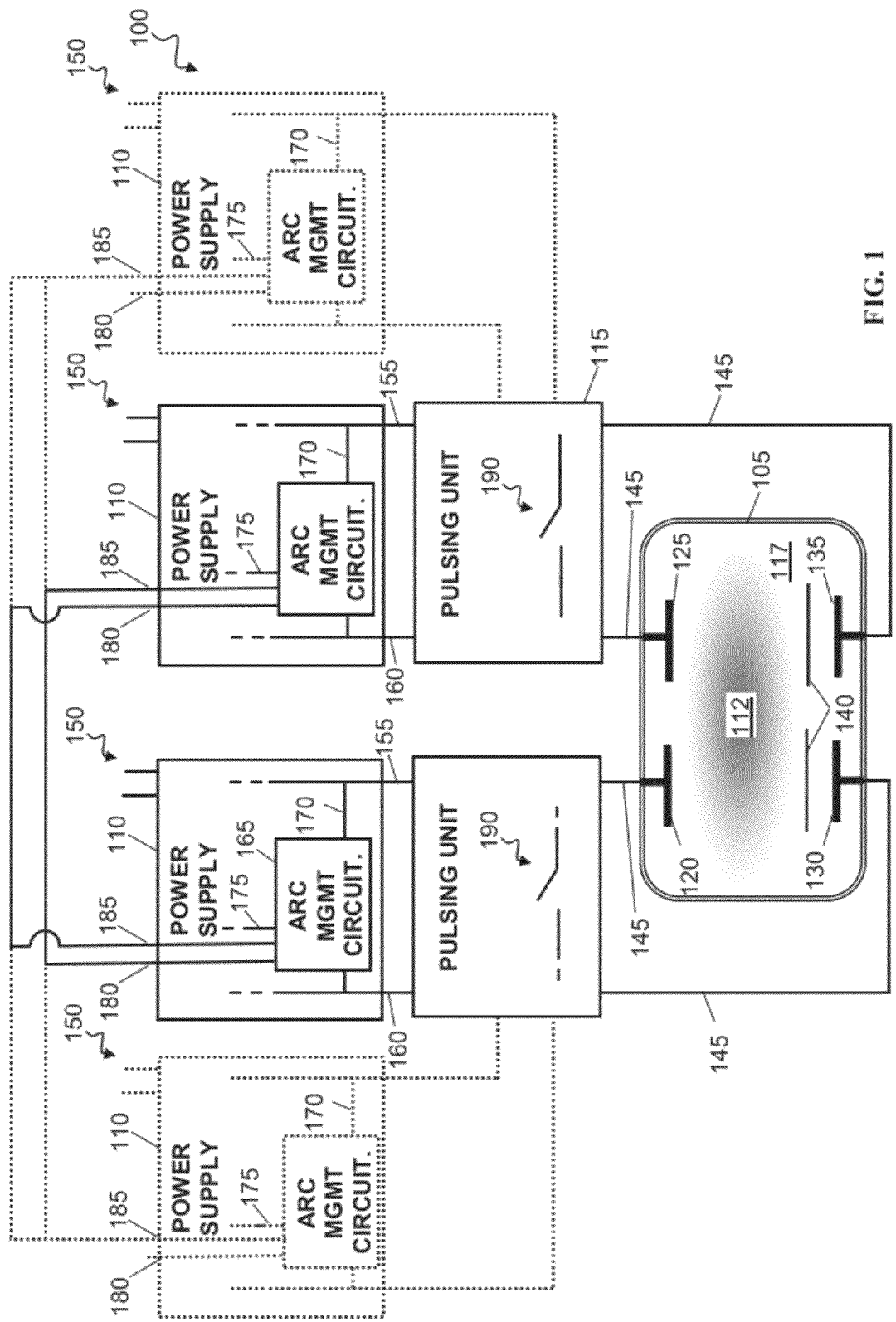
FIG. 1 is a schematic representation of a pulsed plasma system.

FIG. 1 is a schematic representation of a pulsed plasma system 100. Pulsed plasma system includes a chamber 105, two or more plasma power supplies 110, and one or more plasma pulsing units 115. In operation, plasma pulsing units 115 pulse the power provided by power supplies 110 to generate plasma 112 in chamber 105.

Chamber 105 defines an interior volume 117 that can be evacuated to maintain a low-pressure environment suitable for plasma processing. In the illustrated implementation, chamber 105 is prepared for sputtering deposition of films. To this end, two or more cathodes 120, 125 and two or more anodes 130, 135 are disposed in contact with interior volume 117, as are one or more substrates 140. In general, cathodes 120, 125 act as sources of the material that is to be deposited as a film on substrates 140. In some implementations, substrates 140 are in contact with anodes 130, 135. Cathodes 120, 125 and anodes 130, 135 are biasable by pulsed power delivered over supply and return electrical conductors 145 to generate plasma 112.

Plasma power supplies 110 are devices that convert the power received over an AC supply line into a desired power output. The output is generally either a DC output or a radio frequency output. Plasma power supplies 110 each include a supply line input 150 and supply and return electrical output conductors 155, 160. Supply line input 150 can be connected to receive a supply line voltage, e.g., of between 90 and 265 AC volts and 50 to 60 Hz in one or more phases. Plasma power supplies 110 can convert the line supply and as a voltage source, as a current source, or as a power source in outputting power over output conductors 155, 160. Although some portion of the power received over supply line input 150 is lost, e.g., conditioning or otherwise stabilizing the power output over conductors 155, 160, at all of the power output over output conductors 155, 160 is generally received over supply line input 150.

Each plasma power supply 110 also includes internal arc management circuitry 165. Arc management circuitry 165 is a collection of electrical components that are designed to detect a condition indicative of an arc in plasma 112 and manage the output of power from the respective plasma power supply 110 in response. Arcs are localized electrical discharges in a plasma and result in local current densities that are higher than elsewhere in the plasma. The elevated local current densities in an arc can harm plasma processes. Arc management circuitry 165 can be internal to plasma power supply 110 in that arc management circuitry 165 is designed to manage the output of plasma power supply 110 in response to arcs, rather than achieve any particular pulse characteristics. In general, arc management circuitry 165 is housed in a single housing with the remainder of plasma power supply 110.

To detect a condition indicative of an arc in plasma 112, arc management circuitry 165 is generally coupled to receive a signal 170 indicative of the output over conductors 155, 160. The localized electrical discharges of an arc generally decrease the output impedance on conductors 155, 160 and correspondingly impact the power output over conductors 155, 160. In response to detection of the impact of an arc via signal 170, arc management circuitry 165 outputs a signal 175 to manage the arc with an appropriate response. Examples of appropriate responses include internal responses (i.e., responses effectuated exclusively by the same plasma power supply 110 in which arc management circuitry 165 is located), external responses (i.e., a response effectuated exclusively by devices other than the plasma power supply 110 in which arc management circuitry 165 is located), or combinations of internal and external responses. Example internal responses include ending power output over conductors 155, 160 by the same power supply 110 or inverting the polarity of power output over conductors 155, 160 by the same power supply 110. Example external responses include power ending power output over conductors 155, 160 by one or more other power supplies 110, inverting the polarity of power output over conductors 155, 160 by one or more other power supplies 110, or the like.

In some implementations, power supplies 110 can each include an arc management input 180 and an arc management output 185. Arc management input 180 is an input for receiving signals generated by other power supplies 110 indicating the detection of the impact of an arc. Arc management output 185 is an output for sending a signal to other power supplies 110 indicating the detection of the impact of an arc. In operation, the receipt of a signal indicating the detection of the impact of an arc over arc management input 180 can be used to trigger and/or synchronize responses to the arc by the power supplies 110 in system 100.

Arc management circuitry 165 generally need not be implemented using high power components. For example, a voltage divider across conductors 155, 160 can be used to step down the output to a range that is suitable for standard circuit components. Further, although signal 170 is shown on a line that is coupled to conductors 155, 160, a direct connection to conductors 155, 160 is not necessary. For example, signal 170 can be generated using an inductive ammeter or other non-contact techniques.

Plasma pulsing units 115 are devices that pulse the power provided by plasma power supplies 110 to generate a plasma 112 in chamber 105. A single plasma pulsing unit 115 can receive power from multiple plasma power supplies 110 (as shown by the plasma power supplies 110 in both solid and dashed lines) or an individual plasma pulsing unit 115 can receive power from a single plasma power supply 110 (as shown by the plasma power supplies 110 in solid lines only).

Plasma pulsing units 115 implement the changes in power delivery that pulse of the output from plasma power supplies 110. To this end, plasma pulsing units 115 include one or more high-power components 190 that implement the pulsing. For example, plasma pulsing units 115 generally include a high power switch. Plasma pulsing units 115 also generally include one or more high power reactive components that store power for discharge into plasmas under the control of the high power switch.

In general, plasma pulsing units 115 each also include a supply line input (not shown) that can be connected to receive a supply line voltage. However, little or none of the power that is applied to anodes 130, 135 and cathodes 120, 125 to generate plasma 112 in chamber 105 is received over such this supply line. Rather, the majority if not all of the power that generates plasma 112 in chamber 105 is drawn from one or more plasma power supplies 110. Plasma pulsing units 115 can use the power drawn over their own supply lines to, e.g., control switching of high-power components 190, implement their own internal arc management circuitry, and/or to interface with other devices.

In practice, plasma pulsing units 115 are generally connected to interface with a control and monitoring system. For example, a computer programmed to display a user interface that presents information characterizing the operation of pulsed plasma system 100 and allow a user to set process parameters can serve as a control and monitoring system.

In the illustrated implementation, each of a pair of pulsing units is connected to a respective anode 130, 135 and cathode 120, 125 pair. This is not necessarily the case. For example, a single plasma pulsing unit 115 can be connected to multiple anodes 130, 135 and cathodes 120, 125 to bias those anodes 130, 135 and cathodes 120, 125 for generating plasma 112.

Figure 2:
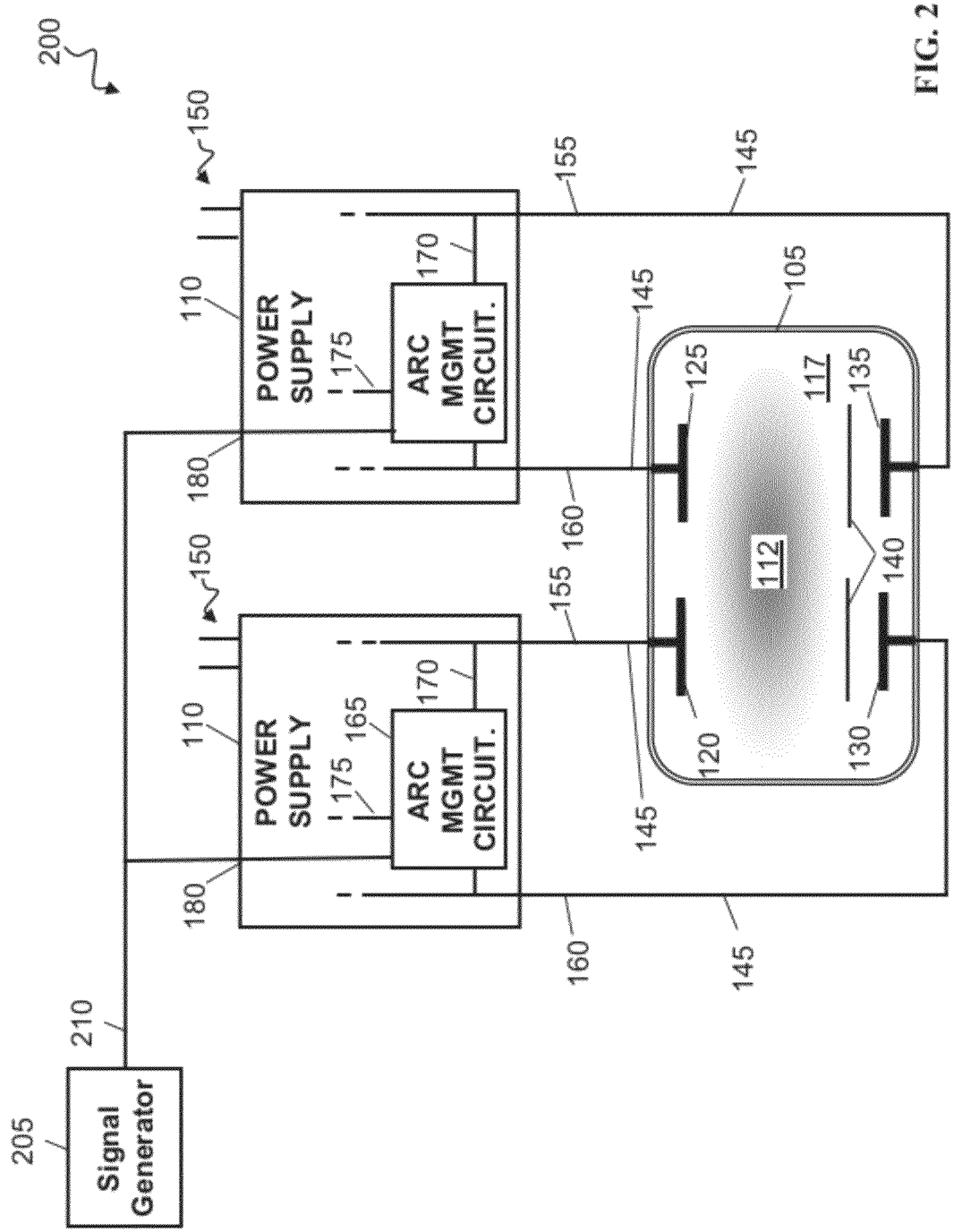
FIG. 2 is a schematic representation of an example of another pulsed plasma system.

FIG. 2 is a schematic representation of an example of a pulsed plasma system 200. In addition to chamber 105 and two or more plasma power supplies 110, pulsed plasma system 200 includes a signal generator 205. In operation, signal generator 205 is coupled to two or more plasma power supplies 110 to trigger the pulsing of power generation by those plasma power supplies 110. Plasma power supplies 110 thus pulse the power provided to generate plasma 112 in chamber 105 themselves. Indeed, in some implementations, supply and return electrical output conductors 155, 160 from power supplies 110 can act as supply and return electrical conductors 145 and bias cathodes 120, 125 and anodes 130, 135 directly (i.e., without intervening pulsing units 115 or other units).

Signal generator 205 generates a pulsing signal 210. Pulsing signal 210 is coupled to arc management circuitry 165 in two or more different power supplies 110 and triggers management of the output of power from the plasma power supplies 110. For example, arc management circuitry 165 can end power output over conductors 155, 160 in response to pulsing signal 210 or invert the polarity of power output over conductors 155, 160 in response to pulsing signal 210.

In some implementations, the arc management triggered by pulsing signal 210 is independent of the processing conditions in chamber 105. Thus, signal generator 205 need not monitor (nor receive the results of monitoring) power delivery to chamber 105. Instead, signal generator 205 can trigger management of the output of power by arc management circuitry 165 independently of processing conditions.

Pulsing signal 210 can be coupled to arc management circuitry 165 in a variety of different ways. For example, in some implementations, pulsing signal 210 can be directly coupled to components in arc management circuitry 165 that implement management of the output of power from that plasma power supply 110. In such implementations, the characteristics of signal generator 205 can be chosen for compatibility with the (generally standard) components that implement arc management circuitry 165. As another example, pulsing signal 210 can be coupled to arc management input 180. In such implementations, the characteristics of pulsing signal 210 can be chosen to emulate the signals that would be found on arc management outputs 185 of other plasma power supplies 110.

In either of these cases, pulsing signal 210 can be a relatively low power signal that is compatible with standard circuit components that form arc management circuitry 165. Signal generator 205 can thus be a relatively inexpensive piece of equipment (e.g., a benchtop signal generator) and the expense of pulsing units, and their high power components, spared.

In some implementations, signal generator 205 can be part of or connected to interface with a control and monitoring system. For example, signal generator 205 can be part of or connected to a programmable logic controller. With a control and monitoring system, the characteristics of pulsing signal 210 can be set by a user to achieve desired characteristics in the power provided to generate plasma 112 in chamber 105.

Figure 3:
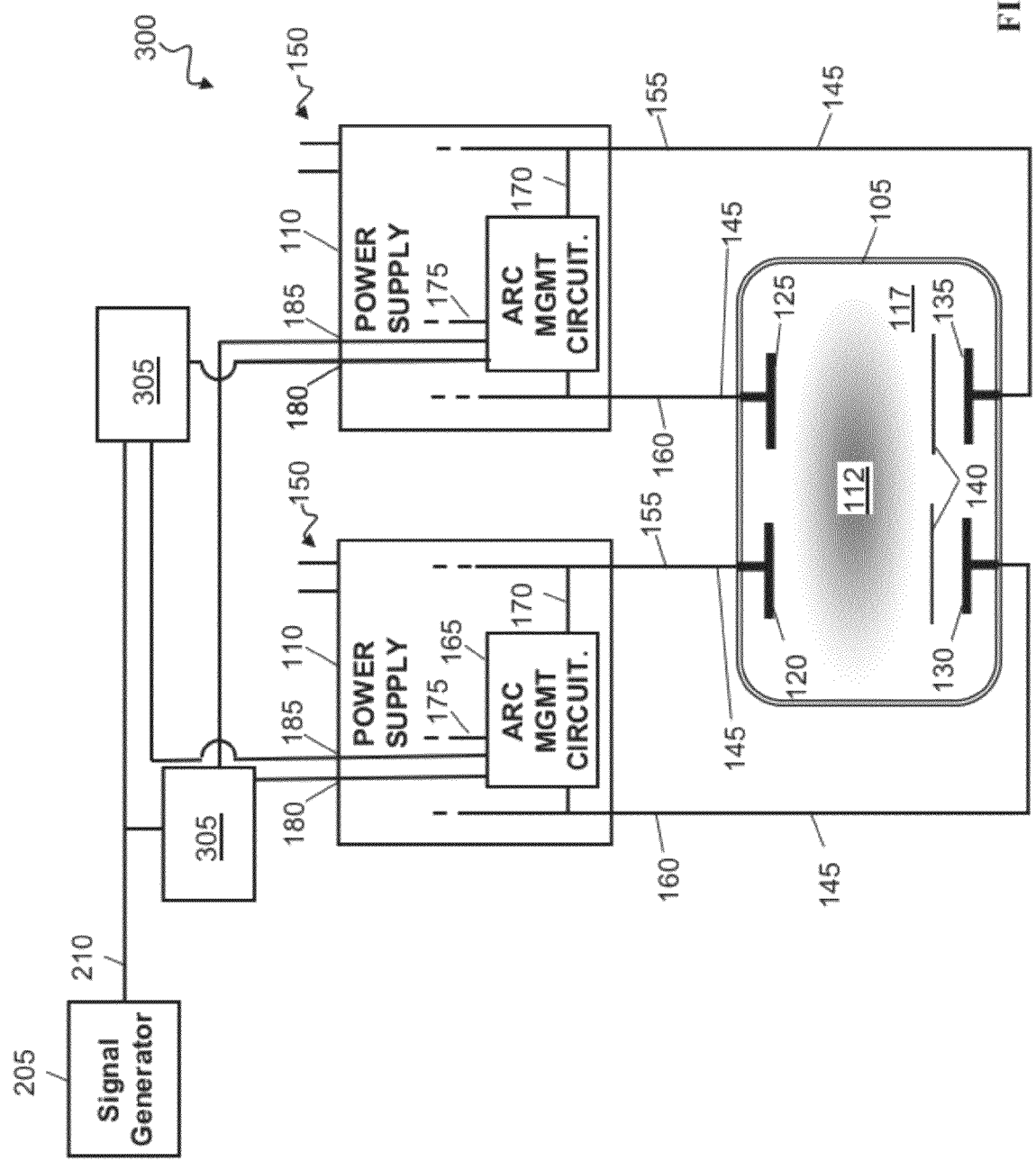
FIG. 3 is a schematic representation of an example of another pulsed plasma system.

FIG. 3 is a schematic representation of an example of a pulsed plasma system 300. In addition to chamber 105, two or more plasma power supplies 110, and signal generator 205, pulsed plasma system 300 includes one or more circuits 305 that combine pulsing signal 210 with signals from other power supplies 110 indicating the detection of the impact of an arc. The signals from the other power supplies 110 are output from the other power supplies 110 over arc management output 185. The combined signals can be coupled to arc management circuitry 165, e.g., via arc management input 180. The combined signals allow the power provided to generate plasma 112 to be pulsed in accordance with both pulsing signal 210 and the any arcs detected by other power supplies 110.

Circuits 305 can perform a variety of different functions depending on the characteristics of power supplies 110. For example, in some implementations, circuits 305 may act as a buffer to ensure that arc management output 185 of a power supply 110 is not damaged by pulsing signal 210. As another example, circuits 305 may amplify or otherwise match pulsing signal 210 with signals from other power supplies 110 to ensure that the combined signal is interpreted properly by the receiving plasma power supply 110. As yet another example, circuits 305 may include logic or other components that synthesize pulsing signal 210 and signals from other power supplies 110 to generate more complex power delivery.

A number of implementations have been described. Nevertheless, it will be understood that various modifications may be made. Accordingly, other implementations are within the scope of the following claims.

What is claimed is:

1. A system comprising:
a plasma chamber having one or more anodes and cathodes arranged for generating a plasma in the plasma chamber;
two or more plasma power supplies each having a pulsed power output suitable for generating the plasma and coupled to respective of the one or more anodes and cathodes of the plasma chamber, the plasma power supplies each comprising:
arc management circuitry, and
an input coupled to trigger, in response to an input signal, pulsing of the power output from the plasma power supply by the arc management circuitry; and
a signal generator supplying the input signal coupled to the inputs of the plasma power supplies, the input signal selected to trigger the pulsing, by the arc management circuitry, of the power output from the plasma power supplies, wherein the signal generator triggers and synchronizes the arc management circuitry independently of conditions within the plasma chamber.

2. The system of claim 1, wherein:
the plasma power supplies each comprise a supply line input connectable to receive a line supply; and
the power output from the plasma power supplies is received over the supply line input and pulsed in the plasma power supplies by the arc management circuitry.

3. The system of claim 1, wherein the input is an arc management input for receiving signals generated by other plasma power supplies indicating the detection of the impact of an arc by those other plasma power supplies.

4. The system of claim 1, wherein output conductors of the plasma power supplies are directly coupled to the one or more anodes and cathodes of the plasma chamber without intervening pulsing units.

5. The system of claim 1, wherein each of the arc management circuitry further comprises an input coupled to receive a signal indicative of the output from the plasma power supply in which it is found.

6. The system of claim 1, wherein each of the arc management circuitry further comprises a switch coupled to end coupling of the output of the respective plasma power supply to the respective of the anodes and cathodes, wherein the switch is responsive to the signal coupled to the input of the plasma power supply in which it is found to end the coupling of the output of the respective plasma power supply to the respective of the anodes and cathodes.

7. The system of claim 1, wherein each of the arc management circuitry is responsive to the signal coupled to the input of the plasma power supply in which it is found to invert polarity of output of the respective plasma power supply.

8. The system of claim 1, wherein the pulsed power output from each plasma power supply has a frequency between 1 and 100 kHz and a power between 1 and 100 kilowatts.

9. The system of claim 1, wherein the input signal coupled to the inputs of the two or more plasma power supplies has a voltage of less than 10 volts.

10. A method comprising:
generating a signal independent of conditions within a plasma chamber;
coupling said signal into inputs of two or more plasma power supplies, wherein the coupling of said signal triggers and synchronizes arc management circuitry of the plasma power supplies; and
coupling pulsed power outputs from each of the plasma power supplies to at least one anode and cathode of the plasma chamber without intervening pulsing units.

11. The method of claim 10, further comprising inverting, by the plasma power supplies, polarity of the pulsed power outputs in response to the signal on the inputs of the two or more plasma power supplies.

12. The method of claim 10, further comprising switching off the pulsed power outputs in response to the signal on the inputs of the two or more plasma power supplies.

13. The method of claim 10, further comprising triggering arc management by the arc management circuitry of a first of the plasma power supplies by a second signal from another of the plasma power supplies, the second signal indicative of an arc in the plasma chamber.

14. The method of claim 13, further comprising combining the second signal and the signal independent of conditions within the plasma chamber to generate a combined signal, wherein the arc management of the first of the plasma power supplies is in accordance with the combined signal.

15. A system comprising:
a plasma chamber having one or more anodes and cathodes arranged for generating a plasma in the plasma chamber;
two or more plasma power supplies each having an AC supply line input and configured to convert power received over the AC supply line input into a desired power output, wherein each of the plasma power supplies comprises arc management circuitry coupled to detect a characteristic in the power output from the plasma power supply indicative of an arc in the plasma chamber and respond to the detected characteristic by managing the power output from the plasma power supply; and
another power supply coupled to the arc management circuitry of each of the two or more plasma power supplies, the arc management circuitry responding the coupling of the other power supply by pulsing the power output from the plasma power supplies.

16. The system of claim 15, wherein the arc management circuitry comprises an arc management output coupled to output a signal to the other of the two or more power supplies indicating detection of an impact of an arc in the plasma chamber.

17. The system of claim 16, further comprising circuitry for combining the signal indicating the detection of the impact of the arc with a signal output from the other power supply to generate a combined signal that is input to the arc management circuitry.

18. The system of claim 17, wherein the circuitry comprises logic components that synthesize the signal indicating the detection of the impact of the arc with the signal output from the other power supply.

19. The system of claim 17, wherein the power outputs of the plasma power supplies are coupled to the one or more anodes and cathodes of the plasma chamber without intervening pulsing units.

* * * * *